(12) United States Patent
Renz et al.

(10) Patent No.: US 8,653,821 B2
(45) Date of Patent: Feb. 18, 2014

(54) HF ATTENUATION

(75) Inventors: Wolfgang Renz, Erlangen (DE); Karsten Wicklow, Bamberg (DE)

(73) Assignee: Siemens Aktiengesellschaft, München (DE)

( * ) Notice: Subject to any disclaimer, the term of this patent is extended or adjusted under 35 U.S.C. 154(b) by 229 days.

(21) Appl. No.: 13/172,803

(22) Filed: Jun. 29, 2011

(65) Prior Publication Data

US 2012/0161763 A1    Jun. 28, 2012

(30) Foreign Application Priority Data

Jun. 30, 2010   (DE) .......................... 10 2010 025 629

(51) Int. Cl.
*G01V 3/00*    (2006.01)
(52) U.S. Cl.
USPC ........................................ 324/318; 324/319
(58) Field of Classification Search
USPC .................... 324/318, 319, 320, 322
See application file for complete search history.

(56) References Cited

U.S. PATENT DOCUMENTS

| | | | |
|---|---|---|---|
| 5,028,872 A * | 7/1991 | Nakabayashi | ................ 324/318 |
| 5,227,727 A * | 7/1993 | Segawa et al. | ................ 324/318 |
| 5,497,773 A | 3/1996 | Kuhara et al. | |
| 5,627,468 A | 5/1997 | Kojima et al. | |
| 7,538,648 B2 * | 5/2009 | Schnell | ......................... 335/216 |
| 7,667,215 B2 * | 2/2010 | Hargrove, Jr. | ............. 250/515.1 |

FOREIGN PATENT DOCUMENTS

DE    103 14 215 B4    11/2006
DE    10 2009 033 084 B3    1/2011

OTHER PUBLICATIONS

German Office Action dated Apr. 7, 2011 for corresponding German Patent Application No. DE 10 2010 025 629.3-54 with English translation.

* cited by examiner

*Primary Examiner* — Louis Arana
(74) *Attorney, Agent, or Firm* — Lempia Summerfield Katz LLC

(57) ABSTRACT

The present embodiments relate to a device and a method for attenuating a high-frequency field of a magnetic resonance tomography system, where at least one attenuation element attenuating high-frequency fields is provided outside a magnetic resonance tomography field of view.

16 Claims, 1 Drawing Sheet

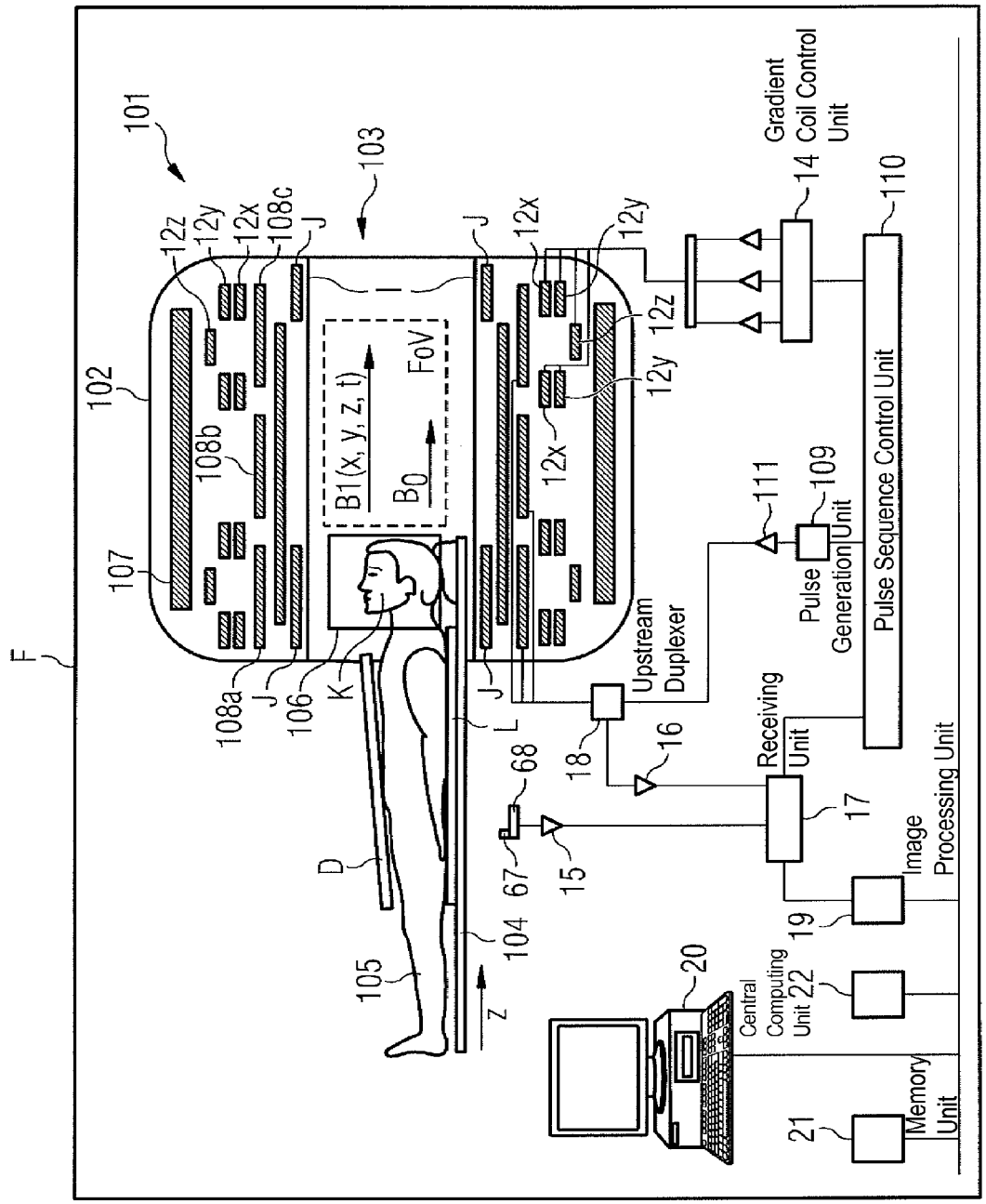

HF ATTENUATION

This application claims the benefit of DE 10 2010 025 629.3, filed Jun. 30, 2010.

BACKGROUND

The present embodiments relate to a device and a method for localized attenuation of a high-frequency field of a magnetic resonance tomography system.

Magnetic resonance devices for examining objects or patients using magnetic resonance tomography (e.g., MR, MRT, MRI) are known, for example, from DE10314215B4.

In application DE 10 2009 033 084.4, a waveguide antenna for a magnetic resonance tomography device is described, the waveguide antenna including a number of metal surfaces and diodes being located between the metal surfaces. The metal surfaces are connected to one another via the diodes for HF signals when the diodes are switched on between the metal surfaces. The metal surfaces are unconnected to one another for HF signals when the diodes are switched off between the metal surfaces.

Magnetic resonance systems (e.g., MRI or MRT) may work with a number of different antennas for emitting high-frequency pulses for nuclear resonance excitation and/or for receiving induced magnetic resonance signals. A magnetic resonance system may have one larger body coil that may be fixedly mounted in the device, as well as several small local coils. In contrast to a body coil, local coils are used to record detailed images of body parts or organs of a patient that are located comparatively close to the body surface or local coil. The control system for the coils of an MRT may also be the transmitting system of the MRT.

A publication by Pruessmann et al. describes an antenna for UHF-MRI that is based on the principle of wave propagation in waveguides, where use is made of the effect that a metal tube, as formed in an MR system (e.g., by an HF screen present by default or an inner metal wall of the magnet), functions as a waveguide as of a particular cut-off frequency. The cut-off frequency may be exceeded in the case of MRT systems.

SUMMARY

The present embodiments may obviate one or more of the drawbacks or limitations in the related art. For example, a magnetic resonance tomography system may be optimized.

BRIEF DESCRIPTION OF THE DRAWINGS

FIG. 1 shows an MRT system.

DETAILED DESCRIPTION OF THE DRAWINGS

FIG. 1 shows (e.g., in a space insulated with a Faraday cage F) an imaging magnetic resonance device MRT 101 with a body coil 102 having a space 103 (e.g., tube-shaped), into which a patient couch 104 bearing a body (e.g., a body of a patient 105 with a local coil arrangement 6) may be guided in the direction of the arrow z in order to generate recordings of the patient 105. The local coil arrangement 106 may, as shown in FIG. 1, be disposed on the patient 105. Recordings may be made of a local region (e.g., of the head K) with the local coil arrangement if the patient 105 is pushed in the direction z into the field of view (FoV) of the imaging magnetic resonance device MRT 101. Signals from the local coil arrangement 106 may be evaluated by an evaluation device (e.g., elements 67, 66, 15, 17) of the imaging magnetic resonance device MRT 101 (e.g., converted into images and saved or displayed) that may be connected to the local coil arrangement 106 (e.g., via coaxial cable or by radio).

In order to examine the body 105 (e.g., the examination object or the patient) with an imaging magnetic resonance device MRT 101 using magnetic resonance imaging, different magnetic fields matched to one another in terms of temporal and spatial characteristics are irradiated onto the body 105. A strong magnet (e.g., a cryomagnet 107) in a measuring booth with an opening 3 (e.g., tunnel-shaped) generates a static strong main magnetic field $B_0$ that is, for example, between 0.2 tesla and 3 tesla or even more. The body 105 to be examined is positioned on the patient couch 104 and guided into a region of the main magnetic field B0, which is partially homogeneous in the field of view FoV. An excitation of the nuclear spin of atomic nuclei of the body 105 is effected via magnetic high-frequency excitation pulses that are irradiated via a high-frequency antenna (e.g., and/or a local coil arrangement) illustrated in FIG. 1 in simplified form as a body coil 108. High-frequency excitation pulses are generated, for example, by a pulse generation unit 109 that is controlled by a pulse sequence control unit 110. Following amplification by a high-frequency amplifier 111, the high-frequency pulses are routed to the high-frequency antenna 108a, b, c. The high-frequency system shown in FIG. 1 is indicated diagrammatically. In other embodiments, more than one pulse generation unit 109, more than one high-frequency amplifier 111 and a plurality of high-frequency antennas 108a, b, c are used in the imaging magnetic resonance device MRT 101.

The imaging magnetic resonance device MRT 101 also includes gradient coils 12x, 12y, 12z, with which magnetic gradient fields are irradiated during a measurement for selective layer excitation and for spatial encoding of the measured signal. The gradient coils 12x, 12y, 12z are controlled by a gradient coil control unit 14 that, like the pulse generation unit 9, is connected to the pulse sequence control unit 110.

The signals transmitted by the excited nuclear spins are received by the body coil 108a, 108b, 108c and/or at least one local coil arrangement 106, amplified by assigned high-frequency preamplifiers 16 and further processed and digitized by a receiving unit 17. The recorded measured data is digitized and stored as complex numerical values in a k-space matrix. From the k-space matrix populated with values, a multidimensional Fourier transformation may be used to reconstruct an associated MR image.

In the case of a coil that may be operated in both transmit and receive mode such as, for example, the body coil 108a, b, c or a local coil, the correct transmission of signals is regulated by an upstream duplexer 18.

An image processing unit 19 generates an image from the measured data. The image is displayed to a user via an operating console 20 and/or is saved in a memory unit 21. A central computing unit 22 controls the individual system components.

In MR tomography, images with a high signal-to-noise ratio (SNR) may be recorded using local coil arrangements (e.g., coils, local coils). The local coil arrangements are antenna systems that are attached in the immediate vicinity on (anterior), under (posterior) or in the body. In the case of an MR measurement, the excited nuclei induce a voltage in the individual antennas of the local coil. The induced voltage is amplified with a low-noise preamplifier (e.g., LNA, Preamp) and is transmitted to the receiving electronics. To improve the signal-to-noise ratio even in the case of high-resolution images, high-field systems (e.g., 1.5 T or 3 T and more) are used. Since more individual antennas may be connected to an MR receiving system than the number of receivers available, a switching matrix (e.g., RCCS) is incorporated between receiving antennas and receiver. This routes the presently active receiving channels (e.g., receiving channels that lie directly in the field of view of the magnet) to the available receivers. As a result, more coil elements than the number of receivers available may be connected, since, in the case of whole-body coverage, only coils that are located in the FoV or in the homogeneity volume of the magnet may be read out.

The local coil system 106 may include, for example, one or more antenna elements (e.g., coil elements) as an array coil. The local coil system 106 includes, for example, coil elements, a preamplifier, further electronics, a housing, supports and a radio connection or a cable with plug, through which the local coil system 106 is connected to the MRT system. A receiver 68 installed on the system side filters and digitizes signals received from the local coil 106, for example, by radio or cable and forwards the data to digital signal processing. The digital signal processing may derive an image or a spectrum from the data obtained from a measurement and makes the image or the spectrum available to a user, for example, for subsequent diagnosis by the user or for storage.

The following describes an exemplary embodiment illustrated in FIG. 1.

An antenna for, for example, UHF-MRI (e.g., UHF-magnetic resonance tomography) may be based on the principle of wave propagation in waveguides. A metal tube, as formed in an MR system (e.g., by a high-frequency (HF) screen present by default or an inner metal wall of an MRT magnet), functions as a waveguide as of a particular cut-off frequency. The cut-off frequency may be exceeded in the case of 7 T systems and typical MR internal system diameters.

Even if this type of MR HF excitation is not used as such (e.g., or explicitly), wave propagation may take place in UHF MR systems with metal inner surfaces of the patient tunnel and corresponding diameters and operating frequencies. This may result in local traditional transmit/receive antennas coupling even with distant body parts via the waveguide property of the environment. When transmitting, this may mean increased performance availability and poorer SNR or image artifacts because of interfoldings when receiving.

In an environment or region of the patient that lies outside the FoV, a localized HF attenuation is provided, for example, by HF-attenuating material such as foamed carbon provided in the environment or the region of the patient that lies outside the FoV.

This may include (e.g., in the case of a head coil K) positioning the torso of the patient 105 on an attenuating positioning cushion L. Additionally or alternatively, the body of the patient 105 may be covered with an attenuation element (attenuating high-frequency fields HF), for example, in the form of a blanket D (e.g., "HF blanket") above and/or to the side of a region of the examination object 105 outside the MRT FoV.

In one embodiment, noise-attenuating material J (selectively) that is also HF-attenuating is chosen and disposed between an inner lining and a gradient coil.

An attenuation element L, D, J attenuating high-frequency fields B1 may include material attenuating high-frequency fields (B1) such as foamed carbon. Alternatively or additionally, an attenuation element L, D, J attenuating high-frequency fields B1 may also be attenuating for high-frequency fields B1 because of shape or structure or other properties.

Only one attenuation element may be provided, or a number of attenuation elements L, D, J may be provided.

Using one or more attenuation elements L, D, J, an SNR optimization may be effected in a UHF magnetic resonance tomography system.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A device for attenuating a high-frequency field of a magnetic resonance tomography system, the device comprising:
    an attenuation element attenuating high-frequency fields, the attenuation element being disposed outside a magnetic resonance tomography field of view of the magnetic resonance tomography system,
    wherein the attenuation element comprises a blanket only partially covering an examination object, the attenuation element containing foamed carbon.

2. The device as claimed in claim 1, wherein the attenuation element attenuating high-frequency fields is disposed only outside the magnetic resonance tomography field of view.

3. The device as claimed in claim 1, wherein the attenuation element contains high-frequency field attenuation material.

4. The device as claimed in claim 1, wherein the attenuation element is a first attenuation element,
    wherein the device further comprises a second attenuation element, the second attenuation element comprising a noise attenuation arrangement that is disposed between an inner lining of the magnetic resonance tomography device and a gradient coil and is attenuating for a high-frequency field.

5. The device as claimed in claim 1, wherein a head coil is provided for magnetic resonance tomography imaging.

6. The device as claimed in claim 1, wherein a positioning cushion that is attenuating for a high-frequency field is provided under an examination object to be recorded by imaging in the magnetic resonance tomography device or only under the torso of an examination object.

7. The device as claimed in claim 1, wherein the magnetic resonance tomography system is a UHF magnetic resonance tomography system, a magnetic resonance tomography system with a field strength of more than 7 T, or a UHF magnetic resonance tomography system with a field strength of more than 7 T.

8. The device as claimed in claim 1, wherein the blanket screens a high-frequency field.

9. A method for attenuation of a high-frequency field of a magnetic resonance tomography system, the method comprising:
    attenuating the high-frequency field with an attenuation element outside a magnetic resonance tomography field of view of the magnetic resonance tomography system, the attenuation element comprising a blanket only partially covering an examination object, the attenuation element containing foamed carbon.

10. The method as claimed in claim 9, wherein attenuating comprises using the attenuation element attenuating the high-frequency field only outside the magnetic resonance tomography field of view.

11. The method as claimed in claim 9, wherein attenuating comprises using the attenuation element, which contains high-frequency field attenuation material.

12. The method as claimed in claim 9, wherein attenuating comprises using a noise attenuation arrangement that is attenuating for a high-frequency field and is disposed between an inner lining of the magnetic resonance tomography device and a gradient coil.

13. The method as claimed in claim 9, further comprises using a head coil for magnetic resonance tomography imaging.

14. The method as claimed in claim 9, wherein attenuating comprises using a positioning cushion that is attenuating for a high-frequency field, the positioning cushion being disposed under an examination object to be recorded by imaging in the magnetic resonance tomography device or only under the torso of the examination object.

15. The method as claimed in claim 9, wherein the magnetic resonance tomography system is a UHF magnetic resonance tomography system, a magnetic resonance tomography system with a field strength of more than 7 T, or a UHF magnetic resonance tomography system with a field strength of more than 7 T.

16. The method as claimed in claim 9, wherein attenuating comprises using the blanket, the blanket screening a high-frequency field.

* * * * *